US010234522B2

(12) United States Patent
Eggers et al.

(10) Patent No.: US 10,234,522 B2
(45) Date of Patent: Mar. 19, 2019

(54) MR IMAGING WITH DIXON-TYPE WATER/FAT SEPARATION

(71) Applicant: KONINKLIJKE PHILIPS N.V., Eindhoven (NL)

(72) Inventors: Holger Eggers, Eindhoven (NL); Adrianus Joseph Willibrordus Duijndam, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 367 days.

(21) Appl. No.: 15/021,774

(22) PCT Filed: Aug. 27, 2014

(86) PCT No.: PCT/EP2014/068111
§ 371 (c)(1),
(2) Date: Mar. 14, 2016

(87) PCT Pub. No.: WO2015/036238
PCT Pub. Date: Mar. 19, 2015

(65) Prior Publication Data
US 2016/0231405 A1 Aug. 11, 2016

(30) Foreign Application Priority Data
Sep. 16, 2013 (EP) .................................... 13184504

(51) Int. Cl.
*G01R 33/48* (2006.01)
*G01R 33/565* (2006.01)
*G01R 33/561* (2006.01)

(52) U.S. Cl.
CPC ...... *G01R 33/4828* (2013.01); *G01R 33/5611* (2013.01); *G01R 33/56518* (2013.01); *G01R 33/5616* (2013.01)

(58) Field of Classification Search
CPC .......... G01R 33/4828; G01R 33/56518; G01R 33/5611; G01R 33/5616; G01R 33/56527; G01R 33/565; G01R 33/56554
USPC ........................................................ 324/309
See application file for complete search history.

(56) References Cited

U.S. PATENT DOCUMENTS 5,594,336 A * 1/1997 Gullapalli .......... G01R 33/4828
324/309
6,147,492 A * 11/2000 Zhang ................ G01R 33/4828
324/307

(Continued)

FOREIGN PATENT DOCUMENTS

EP 2461175 A1 6/2012

OTHER PUBLICATIONS

Aoki et al, "Iterative Decomposition of Water and Fat With Echo Asymmetry and Least-Squares Estimation of the Writst . . . " Journal of Magnetic Resonance Imaging 37 p. 733-738 (2013).

(Continued)

*Primary Examiner* — Patrick Assouad
*Assistant Examiner* — Demetrius R Pretlow

(57) ABSTRACT

An improved method of MR imaging of at least two chemical species having different MR spectra, such as water and fat, enables a precise quantification of water and fat or derived measures, such as a fat fraction. The method includes the steps of: a) generating two or more echo signals at different echo times by subjecting a body (10) placed in the examination volume of a MR device (1) to an imaging sequence of RF pulses and switched magnetic field gradients; b) acquiring the two or more echo signals; c) separating signal contributions of the at least two chemical species to the acquired echo signals on the basis of a signal model including the MR spectrum of each of the chemical species, the spatial variation of the main magnetic field in the examination volume, the effective transverse relaxation rate, and eddy current-induced phase errors. The eddy current-induced phase errors are estimated by a fitting procedure from the two or more echo signals.

19 Claims, 1 Drawing Sheet

(56) References Cited

U.S. PATENT DOCUMENTS

| | | | |
|---|---|---|---|
| 8,373,415 B2 | 2/2013 | Reeder | |
| 8,710,840 B2* | 4/2014 | Gross | G01R 33/565 324/309 |
| 2006/0250131 A1 | 11/2006 | Reeder et al. | |
| 2006/0250132 A1 | 11/2006 | Reeder et al. | |
| 2008/0048657 A1* | 2/2008 | Reeder | G01R 33/4828 324/309 |
| 2009/0072826 A1* | 3/2009 | Hargreaves | G01R 33/4828 324/309 |
| 2010/0244822 A1* | 9/2010 | Yu | G01R 33/5616 324/307 |
| 2011/0140696 A1 | 6/2011 | Yu | |
| 2011/0267054 A1 | 11/2011 | He | |
| 2012/0001633 A1* | 1/2012 | Fuderer | G01R 33/5611 324/309 |
| 2012/0268120 A1* | 10/2012 | Hernando | G01R 33/4828 324/309 |
| 2012/0268121 A1 | 10/2012 | Hernando et al. | |
| 2013/0002247 A1* | 1/2013 | Haacke | G01R 33/56545 324/307 |

OTHER PUBLICATIONS

Yu et al "Single Acquistion Water-Fat Separation: Feasibility Study for Dynamic Imaging" Magnetic Resonance in Medicine vol. 55 p. 413-422 (2006).

Rybicki et al "Fast Three-Point Dixon Mr Imaging Using Low-Resolution Images for Phase Correction: A Comparison With Chemical . . " Americal Journal of Roentgenology vol. 177, No. 5, Nov. 1, 2011 p. 1019-1023.

Yu et al "Combination of Complex-Based and Magnitude-Based Multiecho Water-Fat Separation for Accurate . . . " Magnetic Resonance Im. Med. vol. 66, p. 199-206 (2011).

Hernando et al "Addressing Phase Errors in Fat-Water Imaging Using a Mixed Magnitude/Complex Fitting Method" Magnetic Resonance in Med. vol. 67, p. 638-644 (2012).

Xiang "Two-Point Water Fat Imaging With Partially-Opposed-Phase (POP) Acquisiton" Magnetic Resonance in Medicine vol. 56, p. 572-584 (2006).

Eggers et al "Dual-Echo Dixon Imaging With Flexible Choice of Echo Times" Magnetic Resonance Im Ed. vol. 65, p. 96-107 (2011).

Yu et al "A Reliable Efficient and Flexible Multi-Echo FSE Based Water-Fat Separation Method" Proceedings of the International Soc. for Magnetic Res. in Med. May 1-7, 2010 vol. 18, p. 768.

Reeder et al "Quantitative Assessment of Liver Fat With Magnetic Resonance Imaging and Spectroscopy" Journal of Magnetic Resonance Imaging vol. 34, p. 729-749 (2011).

Yu et al "Phase and Amplitude Correction for Multi-Echo Water-Fat Separation With Bipolar Acquistions" Journal of Magnetic Resonance Imaing vol. 31, p. 1264-1271 (2010).

Peterson et al Fat Quantification Using Multi-Echo Sequences With Bipolar . . . MRM vol. 71, p. 219-229 (2014).

* cited by examiner

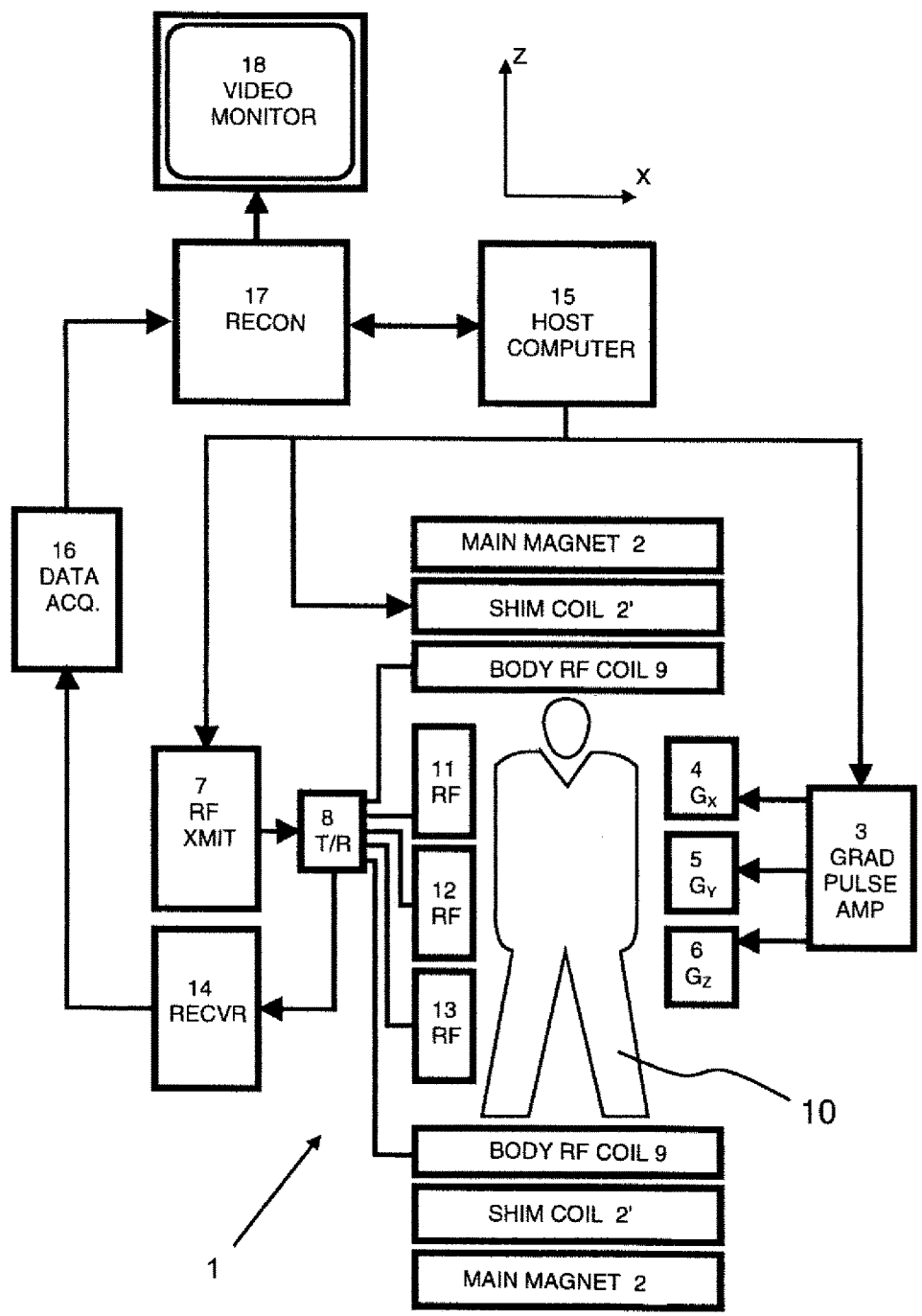

MR IMAGING WITH DIXON-TYPE WATER/FAT SEPARATION

CROSS REFERENCE TO RELATED APPLICATIONS

This application is a U.S. national phase application of International Application No. PCT/EP2014/068111, filed on Aug. 27, 2014, which claims the benefit of EP Application Serial No. 13184504.2 filed on Sep. 16, 2013 and is incorporated herein by reference.

FIELD OF THE INVENTION

The invention relates to the field of magnetic resonance (MR) imaging. It concerns a method of MR imaging of a portion of a body placed in the examination volume of a MR device. The invention also relates to a MR device and to a computer program to be run on a MR device.

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field $B_0$ whose direction at the same time defines an axis (normally the z-axis) of the co-ordinate system on which the measurement is based. The magnetic field $B_0$ produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse) while the magnetic field $B_0$ extends parallel to the z-axis, so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the spins are deflected from the z axis to the transverse plane (flip angle 90°).

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second time constant $T_2$ (spin-spin or transverse relaxation time). The variation of the magnetization can be detected by means of receiving RF coils which are arranged and oriented within an examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneities) from an ordered state with the same phase to a state in which all phase angles are uniformly distributed (dephasing). The dephasing can be compensated by means of a refocusing pulse (for example a 180° pulse). This produces an echo signal (spin echo) in the receiving coils.

In order to realize spatial resolution in the body, switched magnetic field gradients (also referred to as 'gradient pulses') extending along the three main axes are superposed on the uniform magnetic field $B_0$, leading to a linear spatial dependency of the spin resonance frequency. The signal picked up in the receiving coils then contains components of different frequencies which can be associated with different locations in the body. The signal data obtained via the receiving coils correspond to the spatial frequency domain and are called k-space data. The k-space data usually include multiple lines acquired with different phase encoding. Each line is digitized by collecting a number of samples. A set of k-space data is converted to an MR image by means of Fourier transformation.

BACKGROUND OF THE INVENTION

In MR imaging, it is often desired to obtain information about the relative contribution of different chemical species, such as water and fat, to the overall signal, either to suppress the contribution of some of them or to separately or jointly analyze the contribution of all of them. These contributions can be calculated if information from two or more corresponding echoes, acquired at different echo times, is combined. This may be considered as chemical shift encoding, in which an additional dimension, the chemical shift dimension, is defined and encoded by acquiring two or more echoes at different echo times. In particular when applied to the separation of the contributions of water and fat to the overall signal, these types of experiments are often referred to as Dixon-type of measurements. In general such a separation is possible because there is a known precessional frequency difference of hydrogen in fat and water. In its simplest form, Dixon imaging or Dixon water/fat imaging generates water and fat images by either addition or subtraction of the 'in phase' and 'out of phase' datasets. However, this so-called 2-point Dixon technique fails, when $B_0$ field inhomogeneities become larger. This is the case in many clinical applications at high $B_0$ fields where global shimming cannot completely compensate for local field variations. 3-point or 4-point Dixon techniques were developed to correct for these field inhomogeneities. These techniques provide, in addition to a water image and a fat image, a map of $B_0$ field inhomogeneities, the so-called $B_0$ map.

In the known Dixon-type water/fat imaging methods, multiple MR images are acquired at different echo times, wherein each echo signal is conventionally collected in a separate sequence repetition. This increases the minimum scan times by a factor corresponding to the number of different echo time values. In more recent implementations, all echo signals are acquired in a single sequence repetition, that is after a single excitation, by using appropriate multi gradient echo imaging sequences, thereby significantly reducing the required scan times. So-called 'unipolar' imaging sequences may be applied to acquire all echo signals using the same magnetic field gradient polarity. This mostly ensures phase consistency among the echo signals. Alternatively, so-called 'bipolar' imaging sequences may be applied in which the echo signals are collected during both positive and negative magnetic field gradient polarities. This has several advantages. On the one hand, the so-called 'fly-back' magnetic field gradients between the echo signal acquisitions can be dispensed with which improves the signal-to-noise (SNR) efficiency. On the other hand, the minimum required repetition time of the imaging sequence and, thus, scan time can be significantly shortened. Moreover, the minimum echo spacing (echo time increment) can be reduced, whereby the spectral bandwidth in which water/fat can be unambiguously determined is increased. This results in a more robust water/fat separation. However, the bipolar imaging sequences must account for phase errors that result from eddy currents and other system non-idealities. In unipolar acquisitions, the phase errors effectively add a constant phase on all the echo signals which can easily be compensated for, since the relative phases between the echo signals remain unchanged. In bipolar acquisitions, the phase errors effectively add a different constant phase on all the echoes acquired with positive magnetic field gradient polarity and negative magnetic field gradient polarity, thereby disrupting the phase consistency between the individual echo signals which is critical for water/fat separation. In addition, even in unipolar acquisitions, the first, or the first few, echo signals are often affected by further phase errors.

Various strategies have been proposed to minimize the effect of phase errors in bipolar acquisitions. Among them is the approach of performing a correction of the acquired echo signals based on additional calibration measurements (see Yu et al. S, Journal of Magnetic Resonance Imaging 31, 1264-1271, 2010). However, performing an additional calibration measurement to estimate and correct the phase errors requires extra scan time, especially since the phase errors are spatially varying. Further, the paper '*Fat quantification using multi-echo sequences with bilopar gradients: investigation of accuracy and noise performance*' in MRM71 (2014)219-229 by P. Peterson and S. Månsson mentions that off-resonance effects, $T^*_2$ relaxation and eddy current effects are taken into account to correct for phase errors in fat quantification.

SUMMARY OF THE INVENTION

In accordance with the invention, a method of MR imaging of at least two chemical species is disclosed. The method of the invention comprises the steps of:
a) generating two or more echo signals at different echo times by subjecting a body placed in the examination volume of a MR device to an imaging sequence of RF pulses and switched magnetic field gradients;
b) acquiring the two or more echo signals;
c) separating signal contributions of the at least two chemical species to the acquired echo signals on the basis of a signal model including the MR spectrum of each of the chemical species, the spatial variation of the main magnetic field in the examination volume, the effective transverse relaxation rate, and eddy current-induced phase errors, wherein the eddy current-induced phase errors are estimated by a fitting procedure from the two or more echo signals. This procedure is according to the invention applied on a low-resolution level to initially correct the phase errors and then perform a conventional water/fat separation procedure at high resolution that ignores phase errors. In this way, the method benefits from the higher SNR at low resolution. The echo signals at lower spatial resolution are acquired from scanning (sampling) a centre portion of k-space. The echo signals at higher resolution are acquired from scanning (sampling) both the centre and a more peripheral region of k-space. Of course the setting of the centre region of k-space is determined by the desired level of the lower resolution. On the basis of the now accurately estimated phase errors, phase errors in the echo signal acquired at the higher spatial resolution can be corrected. Then, these corrected echo signal at higher spatial resolution can be employed for a Dixon-type water-fat separation that does not require any further correction for phase errors. The invention proposes a fitting method to address the phase errors in chemical shift encoding-based water/fat separation. A signal model is employed that theoretically describes the acquired echo signals as a function of the respective echo time. The signal model includes the (a-priori known) spectrum of each of the chemical species, the (unknown) spatial variation of the main magnetic field in the examination volume, the (unknown) effective transverse relaxation rate, and the (unknown) eddy current-induced phase errors. The fitting procedure seeks values of all unknown parameters of the signal model that best fit the acquired echo signals.

In other words, the invention proposes to model the phase errors and to fit them along with the contributions of the different chemical species, just like the main magnetic field inhomogeneity and the effective transverse relaxation rate. Under the provision that echo signals are acquired at a sufficient number of different echo time values, the true phase errors are established as parameters of the applied signal model and are thus fully taken into account in the process of separating the signal contributions of the different chemical species. As a consequence, the method of the invention enables the unambiguous determination of the contributions of the different chemical species. This makes it possible, for example, to quantitatively determine a fat fraction in a diagnostic examination at high accuracy.

In a preferred embodiment, the signal model attributes a phase error to each echo signal. The signal model may attribute a phase error to all odd versus all even echo signals. In this way, the invention may be employed in combination with a multi gradient echo imaging sequence including switched magnetic field gradients of different polarities (bipolar acquisition) for echo signal refocusing. In addition, the signal model may attribute a phase error to the first versus all subsequent echo signals. The invention thus enables taking the individual phase errors of the echo signals acquired at different echo times into account, such that there is no phase inconsistency between the individual acquired echo signals.

In a further preferred embodiment, the invention suggests a fitting procedure by least-squares estimation of all unknown parameters of the signal model from the acquired echo signals using an iterative, non-linear minimization, such as the known Levenberg-Marquardt algorithm or any other appropriate non-linear minimization algorithm. Adequate initializations should be applied to ensure convergence of the algorithm to the correct minima. Such initializations may be derived, for example, from a subset of the acquired echo signals. An initial estimate of the water and fat contributions may be derived, for example, from a subset of two echo signals by using a conventional 2-point Dixon method.

An ambiguity in at least one of the values of the unknown parameters established by the fitting procedure may be resolved using prior information. Such prior information may be, for example, that the main magnetic field $B_0$ and/or the phase errors vary smoothly over space. An ambiguity may be likewise resolved based on the fit error, or on the combination of the fit error and the spatial smoothness property of the main magnetic field $B_0$ and/or the phase errors In a preferred embodiment, the estimated eddy current-induced phase errors may be corrected in the acquired two or more echo signals before separating signal contributions of the at least two chemical species to the corrected echo signals on the basis of a further (conventional multi-point Dixon) signal model not including eddy current-induced phase errors. This effectively results in an iterative reconstruction scheme, whereby accuracy of the determination of the water and fat contributions may be further increased.

The method of the invention described thus far can be carried out by means of a MR device including at least one main magnet coil for generating a uniform, steady magnetic field $B_0$ within an examination volume, a number of gradient coils for generating switched magnetic field gradients in different spatial directions within the examination volume, at least one body RF coil for generating RF pulses within the examination volume and/or for receiving MR signals from a body of a patient positioned in the examination volume, a control unit for controlling the temporal succession of RF pulses and switched magnetic field gradients, and a reconstruction unit for reconstructing MR images from the received MR signals. The method of the invention can be implemented by a corresponding programming of the reconstruction unit and/or the control unit of the MR device.

The method of the invention can be advantageously carried out on most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWING

The enclosed drawing discloses a preferred embodiment of the present invention. It should be understood, however, that the drawing is designed for the purpose of illustration only and not as a definition of the limits of the invention. In the drawing:

FIG. 1 shows a MR device for carrying out the method of the invention.

DETAILED DESCRIPTION OF THE EMBODIMENTS

In FIG. 1, a MR device 1 is shown. The device comprises superconducting or resistive main magnet coils 2 such that a substantially uniform, temporally constant main magnetic field $B_0$ is created along a z-axis through an examination volume. The device further comprises a set of ($1^{st}$, $2^{nd}$, and—where applicable—$3^{rd}$ order) shimming coils 2', wherein the current flow through the individual shimming coils of the set 2' is controllable for the purpose of minimizing $B_0$ deviations within the examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send/receive switch 8, to a body RF coil 9 to transmit RF pulses into the examination volume. A typical MR imaging sequence is composed of a packet of RF pulse segments of short duration which, together with any applied magnetic field gradients, achieve a selected manipulation of nuclear magnetic resonance. The RF pulses are used to saturate, excite resonance, invert magnetization, refocus resonance, or manipulate resonance and select a portion of a body 10 positioned in the examination volume. The MR signals are also picked up by the body RF coil 9.

For generation of MR images of limited regions of the body 10 by means of parallel imaging, a set of local array RF coils 11, 12, 13 are placed contiguous to the region selected for imaging. The array coils 11, 12, 13 can be used to receive MR signals induced by body-coil RF transmissions.

The resultant MR signals are picked up by the body RF coil 9 and/or by the array RF coils 11, 12, 13 and demodulated by a receiver 14 preferably including a preamplifier (not shown). The receiver 14 is connected to the RF coils 9, 11, 12 and 13 via send/receive switch 8.

A host computer 15 controls the shimming coils 2' as well as the gradient pulse amplifier 3 and the transmitter 7 to generate any of a plurality of MR imaging sequences, such as echo planar imaging (EPI), echo volume imaging, gradient and spin echo imaging, fast spin echo imaging, and the like. For the selected sequence, the receiver 14 receives a single or a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data are reconstructed into an image representation by a reconstruction processor 17 which applies a Fourier transform or other appropriate reconstruction algorithms, such as SENSE or SMASH. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

In an embodiment of the invention, a number of echo signals are generated by means of a multi gradient echo imaging sequence, wherein switched magnetic field gradients of alternating polarities are used for refocusing and readout (frequency encoding). A different echo time value is attributed to each echo signal. For each echo time value, a plurality of phase encodings is applied in order to be able to reconstruct a complete MR image of the desired field-of-view.

The acquired echo signals include signal contributions from fat and water spins. These signal contributions are separated in accordance with the invention on the basis of a signal model. To this end, the composite echo signal $s_n$ in image space, acquired at echo time $t_n = TE_1 + (n-1) \Delta TE$, with $n = 1, 2, \ldots, N$, is modeled as $$\tilde{s}_n = (W + c_n F) e^{i 2\pi \Delta f (n-1) \Delta TE - R_2^* (n-1) \Delta TE} e^{i\theta_n},$$

with $$\theta_n = \begin{cases} \theta_I, & n = 1 \\ 0, & n = 2, 4, \ldots, \\ \theta_O, & n = 3, 5 \ldots \end{cases}$$

wherein $\theta_I$ s a phase error of the first echo signal with respect to the second echo signal, and $\theta_O$ is a phase error of all odd echoes, except for the first echo, with respect to all even echoes. Corresponding amplitude errors may be introduced similarly, but are omitted here for the sake of simplicity. An appropriately modified signal model may be applied in case of temporally non-equidistantly spaced echoes.

W is the unknown complex signal contribution from water spins, F is the unknown complex signal contribution from fat spins, c is a known complex factor describing the amplitude and phase evolution of a pure fat signal over echo time, $\Delta f$ is the unknown off-resonance frequency corresponding to the main magnetic field inhomogeneity, and $R^*_2$ is the unknown effective transverse relaxation rate.

All unknown parameters, including the phase errors $\theta_I$ and $\theta_O$, are estimated by minimizing the residual $$R_C = \sum_{n=1}^{N} |s_n - \tilde{s}_n|^2$$

using an iterative, non-linear minimization, such as the Levenberg-Marquardt algorithm. Therein $s_n$ is the acquired (measured) echo signal at echo time $t_n$.

Alternatively, all unknown parameters, except the initial phase error $\theta_I$, may be estimated by minimizing the modified residual $$R_H = (|s_1| - |\tilde{s}_1|)^2 + \sum_{n=2}^{N} |s_n - \tilde{s}_n|^2,$$

in which any phase error of the first echo is ignored.

Constraints can be set on certain parameter values, to avoid unrealistic estimates, such as negative effective transverse relaxation rates. This can be realized through the use of a constrained optimization algorithm or through the use of penalty functions.

To ensure convergence to correct minima, sufficiently good estimates of some or all parameters should be applied to initialize the algorithm.

A good estimate of W and F may, for example, be obtained by defining $$z = e^{i2\pi \Delta f \Delta TE - R^*_2 \Delta TE},$$

and by considering the subset of echo signals $s_2$, $s_4$, and $s_6$ only, which leads to the following system of equations:

$$s_2 = (W' + c_2 F'),$$

$$s_4 = (W' + c_4 F')z^2,$$

$$s_6 = (W' + c_6 F')z^4,$$

wherein $W' = W z$ and $F' = F z$.

This system of equations may be reduced to a bi-quadratic equation in z, or a quadratic equation in $z^2$, with well-known analytical solutions. For each of the two solutions of $z^2$, there exist two solutions of z, which differ by an offset of $\pi$ in their phase. However, there exists only one solution of $W'$ and $F'$ for each of the two solutions of $z^2$.

In case of very rapid effective transverse relaxation, which leads to poor SNR in the later echoes, an estimate of W and F may alternatively be obtained by applying a 2-point Dixon method to the first two echo signals $s_1$ and $s_2$ (as described, for example, by Eggers et al., Magnetic Resonance in Medicine 65, 96-107, 2011), or by initially ignoring the phase errors and applying a 3-point Dixon method to $s_1$, $s_2$ and $s_3$.

For each solution of W' and F', the contribution of the de- and re-phasing of the water and fat signals to the phase of the composite echo signal can be eliminated, leading to $$\tilde{s}'_n = \frac{\tilde{s}_n}{W' + c_n F'}, \text{ and } \tilde{s}'_n = z^{n-2} e^{i\theta_n}.$$

An estimate of $\theta_O$ is then obtained by $$\theta'_0 = \frac{\arg\{\tilde{s}_2'^* \tilde{s}_3'^2 \tilde{s}_4'^*\}}{2},$$

or similarly from other triples of echo signals, or from weighted combinations of such estimates.

Eliminating the contribution of the de- and re-phasing of the water and fat signals to the phase of the composite echo signal is of no relevance for pure water signals, and of little relevance for pure fat signals, but of substantial relevance for mixed water and fat signals.

To cover the full range of $\theta_O$, the argument in the above equation should be unwrapped before dividing it by 2. In this process, it can be assumed that $\theta_O$ varies smoothly over space and is small close to the iso-center of the main magnet 2. The ambiguity in the phase of z can be resolved in this way as well. This is of course not necessary if the maximum absolute values of $\theta_O$ (and $\theta_I$) are a priori known to be substantially smaller than $\pi$. In this case, explicit constraints on the values of these parameters may be incorporated into the fit procedure. Moreover, sufficiently good estimates of some or all parameters to initialize the iterative, non-linear minimization may be obtained in simpler ways, for instance by ignoring the phase errors.

Given two solutions of W', F', z, $\theta_O$ and $\theta_I$, one may be selected using methods per se well-known in the field of chemical shift encoding-based water/fat separation, such as region growing, which may exploit in this case that both $\Delta f$, i.e. the phase of z, $\theta_O$ and $\theta_I$ are expected to vary smoothly over space. In addition, the residuum, or more generally the value of the objective function of the fitting procedure, for the two solutions may be compared in this process.

The described procedure may be applied on a low-resolution level to initially correct the phase errors and then perform a conventional water/fat separation procedure at high resolution that ignores phase errors. In this way, the method benefits from the higher SNR at low resolution. Alternatively, the described procedure may be applied directly at high resolution to obtain estimates of W and F while fully considering the phase errors.

The invention claimed is:

1. A method of magnetic resonance (MR) imaging of at least two chemical species, the method comprising the steps of:
   a) generating echo signals at different echo times by subjecting a body placed in the examination volume of a MR device to an imaging sequence of RF pulses and switched magnetic field gradients;
   b) acquiring at least four echo signals at a lower spatial resolution;
   c) estimating phase errors in the acquired echo signals at the lower spatial resolution from the at least four echo signals;
   d) acquiring the at least four echo signals at a higher spatial resolution, e) correcting the at least four echo signals at the higher resolution based on the phase errors estimated at the lower resolution;
f) separating signal contributions of the at least two chemical species to the acquired echo signals at a higher spatial resolution with a multi-point Dixon separation technique;
g) reconstructing the signal contribution of at least one of the chemical species into a chemical species image; and
h) displaying the chemical species image.

2. The method of claim 1, wherein the errors are estimated on the basis of a MR spectrum of each of the chemical species, a spatial variation of the main magnetic field in the examination volume, and an effective transverse relaxation rate.

3. The method of claim 2, wherein the phase errors are estimated based on a signal model to determine the contributions of the at least two chemical species, the spatial variation of the main magnetic field, the effective transverse relaxation rate, and eddy current-induced phase errors such that the signal model best fits the acquired two or more echo signals.

4. The method of claim 3, wherein the signal model is $$\tilde{s}_n = (W + c_n F) e^{i 2 \Pi \Delta f (n-1) \Delta TE - R_2^* (n-1) \Delta TE} e^{i \theta_n},$$

where W is a complex signal contribution from water spins, F is a complex signal contribution from fat spins, c describes an amplitude and phase evolution of a pure fat signal over the echo time, $\Delta f$ is an off-resonance frequency corresponding to inhomogeneity in the steady magnetic field $B_0$, and $R^*_2$ is an effective transverse relaxation rate.

5. The method of claim 1, wherein the chemical species are fat and water and the reconstructing step includes:
reconstructing a fat image and a water image.

6. The method of claim 1, wherein an ambiguity in a value of at least one of the contributions of the at least two chemical species, the spatial variation of the main magnetic field, the effective transverse relaxation rate, and eddy current-induced phase errors is resolved using prior information.

7. The method of claim 6, wherein the ambiguity is resolved by restraining the main magnetic field and/or the eddy current-induced phase errors to vary smoothly over space.

8. The method of claim 1, wherein the imaging sequence is a multi gradient echo sequence including switched magnetic field gradients of different polarities.

9. The method of claim 1, wherein the higher resolution echo signals cover peripheral and central portions of k-space and the lower resolution echo signals are limited to the central portion of k-space.

10. A magnetic resonance (MR) imaging device comprising: at least one main magnet coil for generating a uniform, steady magnetic field $B_0$ within an examination volume, a number of gradient coils for generating switched magnetic field gradients in different spatial directions within the examination volume, at least one RF coil for generating RF pulses within the examination volume and/or for receiving MR signals from a body of a patient positioned in the examination volume, a display configured to display diagnostic images, and one or more processors configured to:
control the at least one RF coil and the gradient coils to induce a first lower resolution series of n RF pulses iteratively at echo times Tn, where n≥4, and repeat the inducing of the series of n RF pulses at the echo times Tn with a plurality of phase encoding in a central portion of k-space;
minimize a residual Rc where $$R_C = \sum_{n=1}^{N} |s_n - \tilde{s}_n|^2,$$

where $s_n$ is an acquired magnetic resonance signal induced by the nth RF pulse and $\tilde{s}_n$ is:

$$\tilde{s}_n = (W + c_n F) e^{i 2 \Pi \Delta f (n-1) \Delta TE - R_2^* (n-1) \Delta TE} e^{i \theta_n},$$

where $$\theta_n = \begin{cases} \theta_{1,n} = 1 \\ 0, n = 2, 4, \ldots, \\ \theta_0, n = 3, 5, \ldots \end{cases}$$

where W is an unknown complex signal contribution from water spins,
where c describes a known amplitude and phase evolution of a pure fat signal over the echo time,
where $\Delta f$ is an unknown off-resonance corresponding to a uniform, steady magnetic field $B_0$ inhomogeneity, and
where $R^*_2$ is an unknown effective transverse relaxation time,
wherein the minimizing applies an iterative, non-linear minimization to determine values of W, $\Delta f$, $R^*_2$, which minimize Rc,
control the at least one RF coil and the gradient coils to generate a second, high resolution series of n RF pulses iteratively at the echo times Tn, where n≥4, and repeat the inducing of the series of n RF pulses at the echo times Tn with a plurality of phase encoding over k-space,
correct the second series of RF pulses in accordance with the determined values of W, $\Delta f$, $R^*_2$, which minimized Rc and reconstruct the second series of RF pulses into high resolution images,
using a Dixon technique, determine at least one of a one chemical species image from the second series of high resolution images, and
control the display device to display the at least one chemical species image.

11. A computer program stored on a non-transitory computer readable medium carrying a computer program to be executed on a magnetic resonance (MR) device, which computer program comprises instructions for:
a) generating a plurality of series of echoes, each series including at least four echo signals at predetermined echo times by repeatedly applying an imaging sequence of RF pulses and switched magnetic field gradients;
b) acquiring the first plurality of series of at least four echo signals at a lower spatial resolution;
c) estimating eddy current induced phase errors in the acquired echo signals at a lower spatial resolution by a fitting procedure from at least four echo signals on the basis of a signal model including an MR spectrum of each of the chemical species, a spatial variation of the main magnetic field in the examination volume, and an effective transverse relaxation rate, d) acquiring a second plurality of a series of at least four echo signals at a higher spatial resolution, e) separating signal contributions of the at least two chemical species to the acquired echo signals quantitatively at the higher spatial resolution on the basis of the estimated eddy current-induced phase errors;

f) reconstructing the higher resolution echo signals into images specific to each of the at least two chemical species, and g) controlling a display device to display at least one of the reconstructed images.

12. The method of claim 1, wherein the at least four echo signals includes at least six echo signals that are acquired at the lower spatial resolution.

13. The method of claim 12, wherein estimating the phase errors in the acquired echo signals at a lower spatial resolution by a fitting procedure from the at least at least six echo signals on the basis of a signal model including the MR spectrum of each of the chemical species, the spatial variation of the main magnetic field in the examination volume, and the effective transverse relaxation rate.

14. The MR imaging device of claim 10, wherein the at least four echo signals includes at least six echo signals that are acquired at the lower resolution.

15. The MR imaging device of claim 14, wherein the estimated phase errors in the acquired echo signals at the lower spatial resolution are determined by a fitting procedure from the at least at least six echo signals on the basis of a signal model including an MR spectrum of each of the chemical species, the spatial variation of the main magnetic field in the examination volume, and the effective transverse relaxation rate.

16. The MR imaging device of claim 10, wherein the non-linear minimization is performed with a Levenberg-Marquardt algorithm.

17. A magnetic resonance (MR) imaging device comprising:

a main magnet configured to generate a steady magnetic field $B_0$ within an examination volume;

gradient coils configured to generate switched magnetic field gradients in each of a plurality of spatial directions within the examination volume;

at least one RF coil configured to generate RF pulses within the examination volume and/or to receive magnetic resonance signals from a subject disposed in the examination volume;

a display device configured to display diagnostic images of the subject; and one or more computer processors configured to:

control the at least one RF coil and the gradient coils to induce a series of RF pulses at echo times $t_1$-$t_n$, where n≥4 with a lower resolution, acquiring a series of n echoes at a lower spatial resolution, estimating phase errors in the acquired echo signals at the lower spatial resolution by fitting the acquired echo signals with a signal model, acquiring an additional series of echo signals at a higher spatial resolution, correcting the echo signals acquired at the higher spatial resolution using the phase errors estimated from the echo signals at the lower resolution, performing a Dixon-type water-fat separation on the series of RF signals acquired at the higher resolution and reconstructing the RF signals acquired at the higher spatial resolution into at least one of a water image and a fat image of the subject disposed in the examination volume, and controlling the display device to display the at least one reconstructed image of the subject.

18. The MR imaging device according to claim 17, wherein the signal model is:

$$\tilde{S}_{n=(W+c_n F)} e^{j2\Pi\Delta f(n-1)\Delta TE - R_2^*(n-1)\Delta TE} e^{i\theta_n},$$

where W is a complex signal contribution from water spins, F is a complex signal contribution from fat spins, c describes an amplitude and phase evolution of a pure fat signal over the echo time, $\Delta f$ is an off-resonance frequency corresponding to inhomogeneity in the steady magnetic field $B_0$, and $R^*_2$ is an effective transverse relaxation rate.

19. The MR imaging device according to claim 18, wherein the one or more computer processors fit the echo signals at the lower resolution with the signal model using a Levenberg-Marquardt non-linear minimization algorithm.

* * * * *